United States Patent
He et al.

(10) Patent No.: US 10,714,596 B2
(45) Date of Patent: Jul. 14, 2020

(54) DIRECTIONAL DEPOSITION OF PROTECTION LAYER

(71) Applicant: INTERNATIONAL BUSINESS MACHINES CORPORATION, Armonk, NY (US)

(72) Inventors: Hong He, Schenectady, NY (US); Juntao Li, Cohoes, NY (US); Junli Wang, Slingerlands, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/627,680

(22) Filed: Jun. 20, 2017

(65) Prior Publication Data

US 2017/0294524 A1 Oct. 12, 2017

Related U.S. Application Data

(63) Continuation of application No. 15/060,116, filed on Mar. 3, 2016, now Pat. No. 9,837,535.

(51) Int. Cl.
  *H01L 29/78* (2006.01)
  *H01L 29/66* (2006.01)
  *H01L 29/06* (2006.01)
  *H01L 29/08* (2006.01)
  *H01L 29/161* (2006.01)
  (Continued)

(52) U.S. Cl.
  CPC .... *H01L 29/66795* (2013.01); *H01L 29/0649* (2013.01); *H01L 29/0847* (2013.01); *H01L 29/1037* (2013.01); *H01L 29/1054* (2013.01); *H01L 29/161* (2013.01); *H01L 29/165* (2013.01); *H01L 29/785* (2013.01); *H01L 29/7848* (2013.01)

(58) Field of Classification Search
  CPC .................... H01L 29/66795; H01L 29/0649
  See application file for complete search history.

(56) References Cited

U.S. PATENT DOCUMENTS

| | | |
|---|---|---|
| 6,054,343 A | 4/2000 | Ashburn |
| 6,784,077 B1 | 8/2004 | Lin et al. |
| 8,372,489 B2 | 2/2013 | Hautala |
| (Continued) | | |

FOREIGN PATENT DOCUMENTS

| | | |
|---|---|---|
| KR | 2002-0002804 A | 1/2002 |
| WO | 2009/042484 A1 | 4/2009 |

OTHER PUBLICATIONS

List of IBM Patents or Patent Applications Treated as Related dated Jun. 20, 2017, 2 pages.

*Primary Examiner* — Mohammad M Choudhry
(74) *Attorney, Agent, or Firm* — Tutunjian & Bitetto, P.C.; Vazken Alexanian

(57) ABSTRACT

A method for forming a fin device includes forming semiconductor fins over a first dielectric layer. A second dielectric layer is directionally deposited into or on the first dielectric layer and on tops of the fins on horizontal surfaces. The second dielectric layer is configured to protect the first dielectric layer in subsequent processing. Sidewalls of the fins are precleaned while the first dielectric layer is protected by the second dielectric layer. The second dielectric layer is removed to expose the first dielectric layer in a protected state.

18 Claims, 5 Drawing Sheets

(51) Int. Cl.
*H01L 29/165* (2006.01)
*H01L 29/10* (2006.01)

(56) References Cited

U.S. PATENT DOCUMENTS

| | | | |
|---|---|---|---|
| 8,586,455 B1* | 11/2013 | Chang | H01L 27/1104 |
| | | | 257/E21.545 |
| 8,637,381 B2 | 1/2014 | Leobandung et al. | |
| 9,070,742 B2 | 6/2015 | Xie et al. | |
| 9,082,851 B2 | 7/2015 | Ramachandran et al. | |
| 2007/0221956 A1* | 9/2007 | Inaba | H01L 21/82380 |
| | | | 257/197 |
| 2009/0152596 A1* | 6/2009 | Yang | G01N 27/4145 |
| | | | 257/253 |
| 2011/0062518 A1* | 3/2011 | Chan | H01L 29/66795 |
| | | | 257/347 |
| 2011/0298025 A1* | 12/2011 | Haensch | H01L 21/823431 |
| | | | 257/296 |
| 2013/0316513 A1* | 11/2013 | Basker | H01L 21/845 |
| | | | 438/400 |
| 2013/0328112 A1* | 12/2013 | Xie | H01L 29/6653 |
| | | | 257/288 |
| 2014/0027863 A1* | 1/2014 | Adam | H01L 29/16 |
| | | | 257/410 |
| 2014/0035010 A1* | 2/2014 | Cai | H01L 29/6653 |
| | | | 257/288 |
| 2014/0306297 A1 | 10/2014 | Ching et al. | |
| 2014/0312420 A1* | 10/2014 | Adam | H01L 27/1211 |
| | | | 257/347 |
| 2015/0279973 A1* | 10/2015 | Akarvardar | H01L 29/66795 |
| | | | 438/283 |
| 2015/0287809 A1* | 10/2015 | Kerber | H01L 21/845 |
| | | | 438/479 |

\* cited by examiner

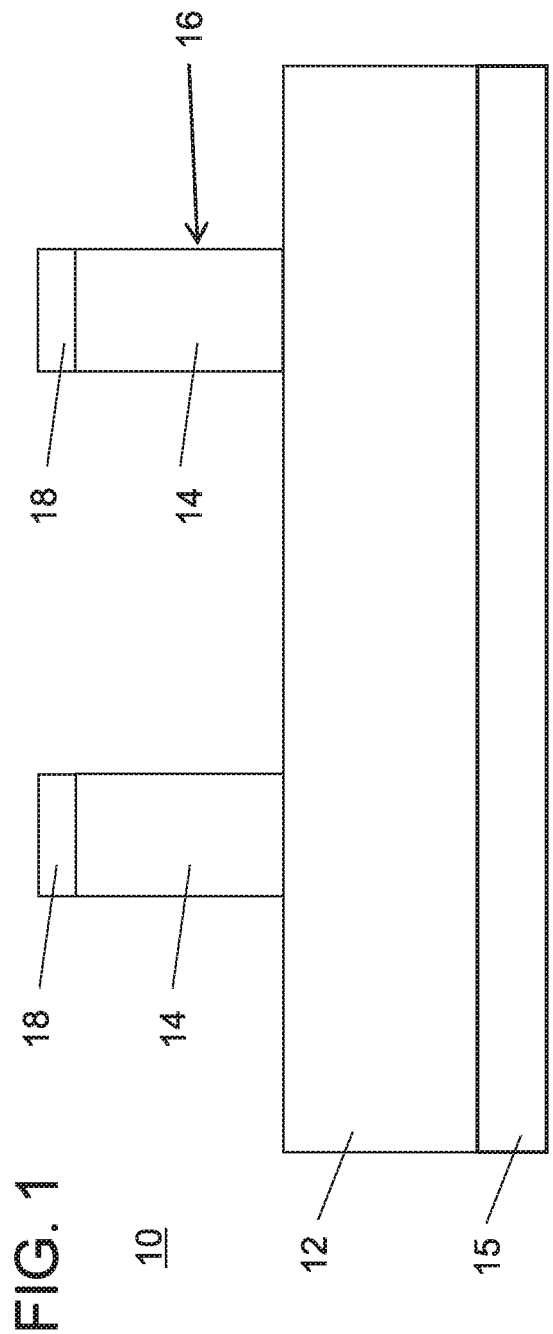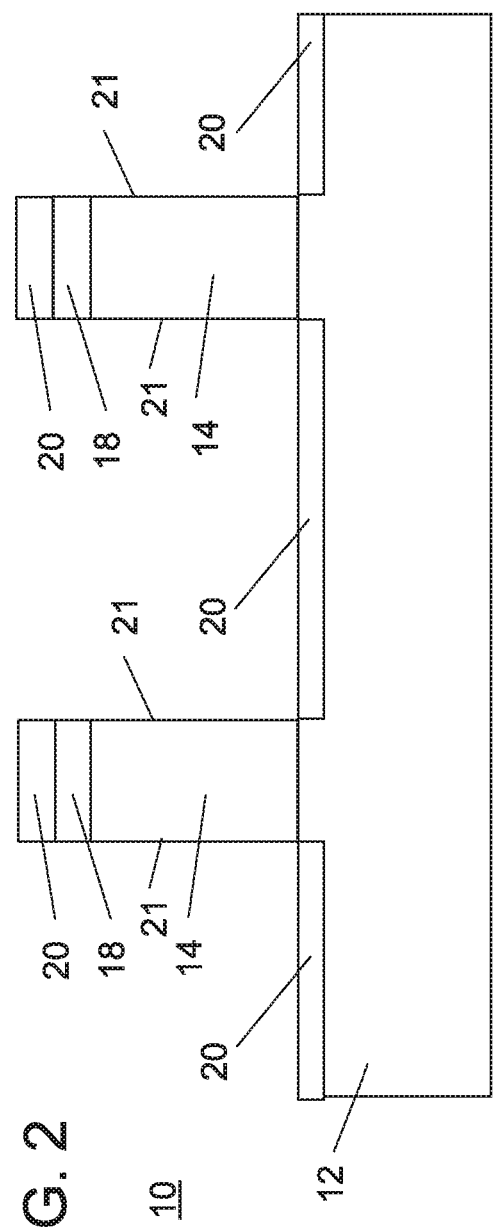

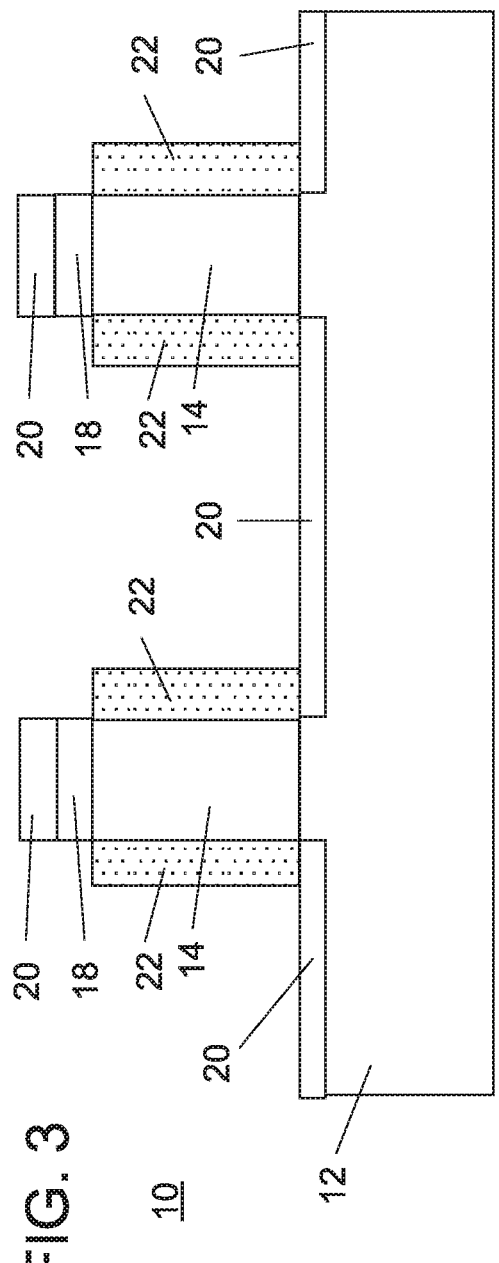
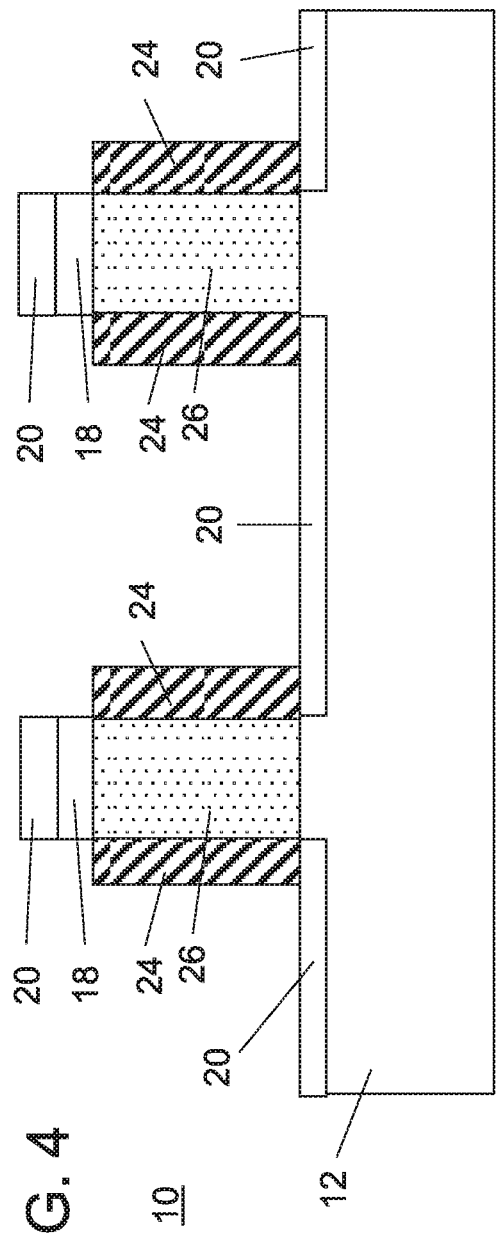

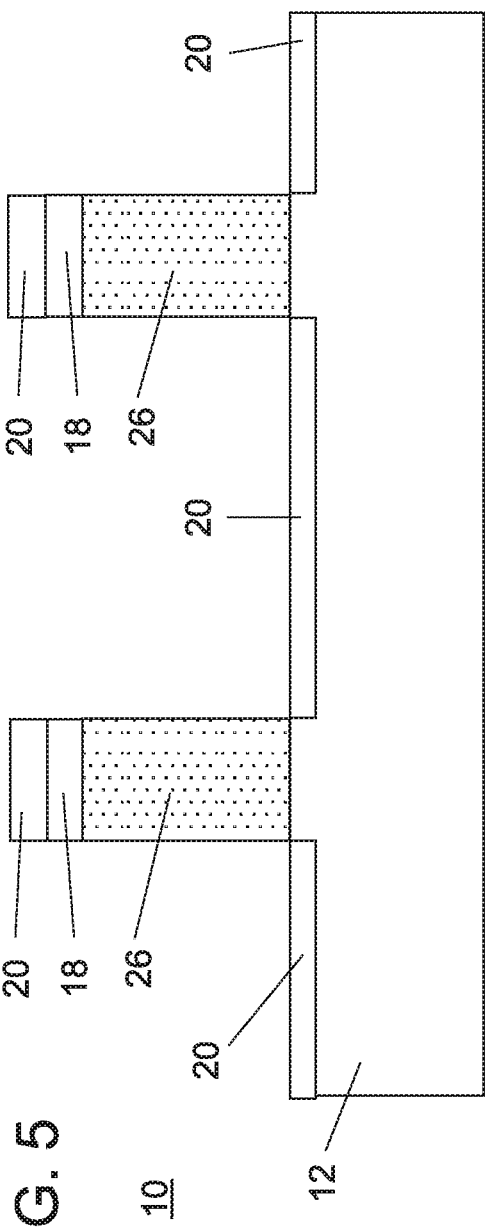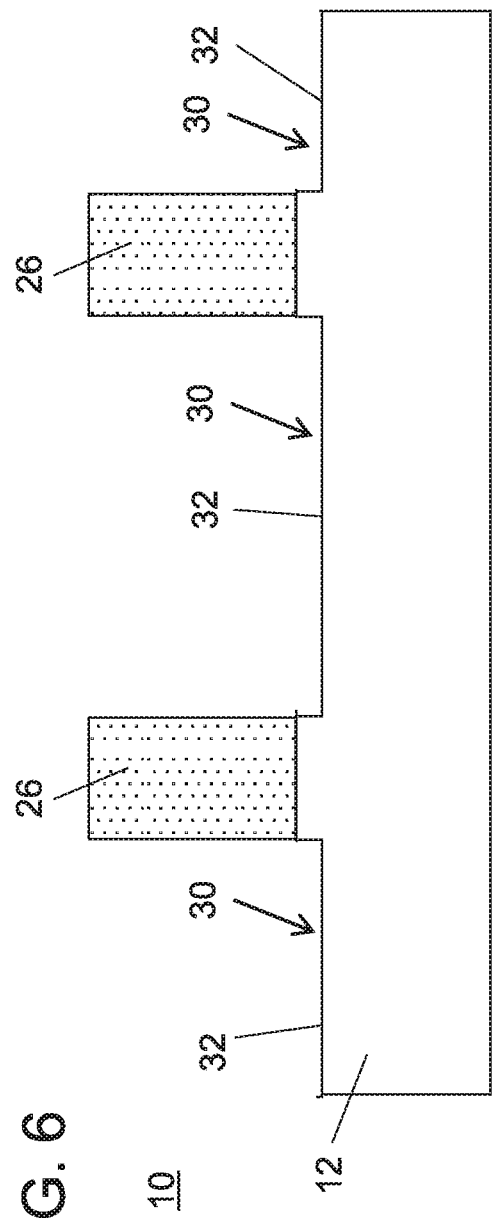

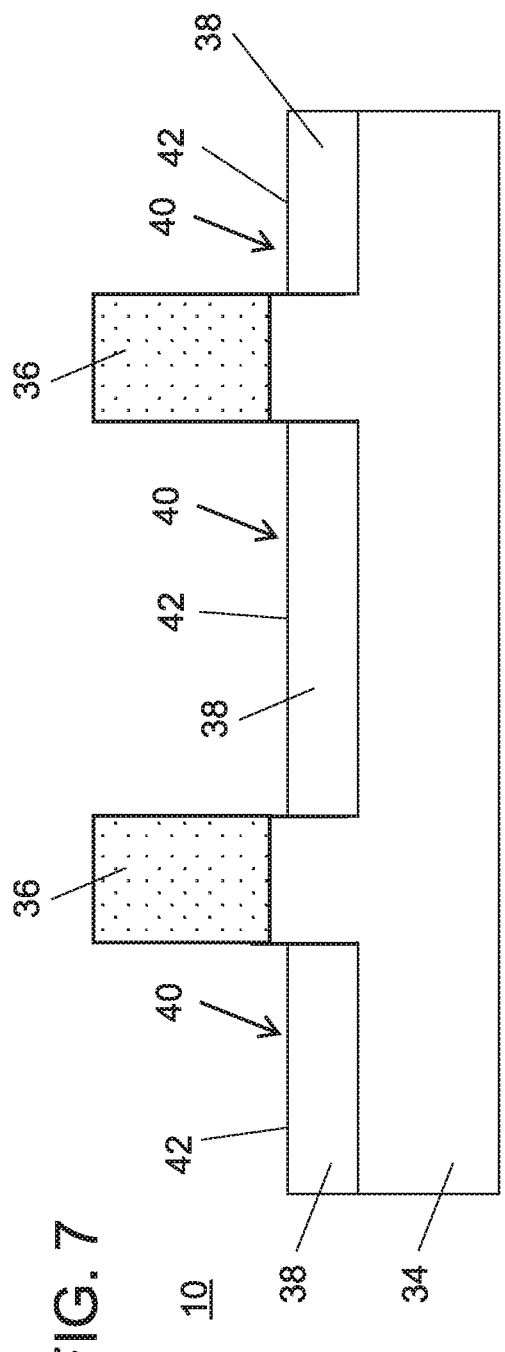

DIRECTIONAL DEPOSITION OF PROTECTION LAYER

BACKGROUND

Technical Field

The present invention relates to semiconductor processing, and more particularly to devices and methods for device fabrication, which employ directionally formed nitride to protect layers during processing.

Description of the Related Art

During device fabrication, previously formed structures may be at risk of damage due to subsequent processing. In one example, buried oxide (BOX) layers and shallow trench isolation (STI) regions formed in or on a substrate may be damaged by one or more preclean processes. The preclean processes may be needed to provide a clean silicon interface to start epitaxial deposition, e.g., on semiconductor fin structures employed to form fin field effect transistors. Such a preclean process consumes oxide of one or more of the BOX for a silicon-on-insulator substrate case or STI for bulk substrate case. The consumption of oxide or oxide gouging can cause subsequent process integration issues.

SUMMARY

A method for forming a fin device includes forming semiconductor fins over a first dielectric layer. A second dielectric layer is directionally deposited into or on the first dielectric layer and on tops of the fins on horizontal surfaces. The second dielectric layer is configured to protect the first dielectric layer in subsequent processing. Sidewalls of the fins are precleaned while the first dielectric layer is protected by the second dielectric layer. The second dielectric layer is removed to expose the first dielectric layer in a protected state.

Another method for forming a fin device includes forming semiconductor fins over a first dielectric layer; directionally depositing a second dielectric layer into or on the first dielectric layer and on tops of the fins on horizontal surfaces, the second dielectric layer being configured to protect the first dielectric layer in subsequent processing; precleaning sidewalls of the fins while the first dielectric layer is protected by the second dielectric layer; growing epitaxial regions on the sidewalls of the fins; condensing material from the epitaxial regions into the fins while altering the epitaxial regions to form dielectric regions; removing the dielectric regions; and removing the second dielectric layer to expose the first dielectric layer in a protected state.

Yet another method for forming a fin device includes forming silicon fins over a first dielectric layer formed from an oxide; directionally depositing a second dielectric layer into or on the first dielectric layer and on tops of the fins on horizontal surfaces, the second dielectric layer being configured to protect the first dielectric layer in subsequent processing, the second dielectric layer including silicon nitride; precleaning sidewalls of the fins while the first dielectric layer is protected by the second dielectric layer; growing epitaxial regions including SiGe on the sidewalls of the fins; condensing Ge from the epitaxial regions into the fins to form high mobility fins while oxidizing the epitaxial regions; removing the epitaxial regions, which have been oxidized; and removing the second dielectric layer to expose the first dielectric layer in a protected state.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 1 is a cross-sectional view of a semiconductor device having semiconductor fins formed from a semiconductor layer of a semiconductor-on-insulator (SOI) substrate in accordance with the present principles;

FIG. 2 is a cross-sectional view of the semiconductor device of FIG. 1 having a directionally deposited dielectric material formed on a hardmask over the fins and in or on a buried dielectric of the SOI substrate in accordance with the present principles;

FIG. 3 is a cross-sectional view of the semiconductor device of FIG. 2 after precleaning fins and forming epitaxial regions on side surfaces of the fins in accordance with the present principles;

FIG. 4 is a cross-sectional view of the semiconductor device of FIG. 3 after condensation to drive dopants into the fins from the epitaxial regions and to convert the epitaxial regions to dielectric material in accordance with the present principles;

FIG. 5 is a cross-sectional view of the semiconductor device of FIG. 4 after removal of the dielectric material of the converted epitaxial regions in accordance with the present principles;

FIG. 6 is a cross-sectional view of the semiconductor device of FIG. 5 after removal of the directionally deposited dielectric and the hardmask to expose the buried dielectric in a protected state in accordance with the present principles;

FIG. 7 is a cross-sectional view of a semiconductor device formed on a bulk substrate and having a shallow trench isolation (STI) region in a protected state using a directionally directed protection layer in accordance with the present principles.

DETAILED DESCRIPTION

Figure 8:
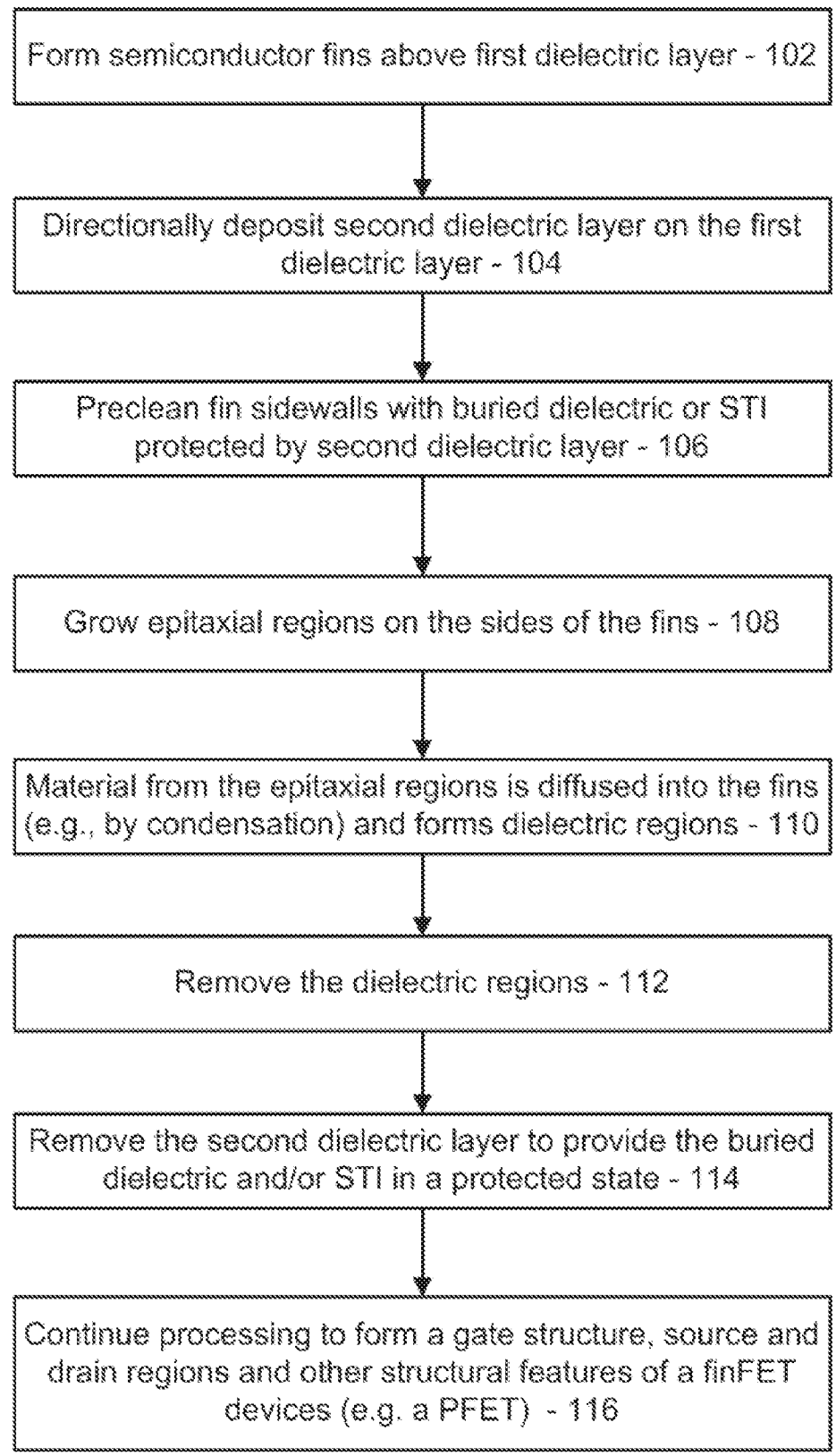
FIG. 8 is a block/flow diagram showing methods for semiconductor device fabrication using a protection layer to maintain a buried dielectric layer or STI in accordance with illustrative embodiments.

In accordance with the present principles, dielectric gouging due to harsh processing conditions is reduced or eliminated. In one particularly useful embodiment, a directional deposition is performed to prevent gouging due to epitaxy preclean processing. The directional deposition may include a directional nitride deposition process and, in particular, a directional SiN deposition process. Material of the directional deposition may be employed to protect existing structures and materials and, in particular, oxide materials, such as buried oxide (BOX) or shallow trench isolation (STI) regions. Semiconductor fins may be formed on the BOX or STI structures. With the formation of the directional deposition material, the BOX or STI regions are protected during preclean operations on the semiconductor fins, which are formed on the BOX or STI structures.

In useful embodiments, fins etched from a semiconductor layer (e.g., in a semiconductor-on-insulator (SOI) substrate) may include Si and may be employed as a template to epitaxially grow high mobility channel materials on lateral sides of the fin. This method is advantageous for fabricating high mobility channel devices. To epitaxially grow the high mobility channel materials, the template needs to be cleaned by a preclean process to provide satisfactory silicon interface to start the epitaxy. The present principles provide methods to address the dielectric gouging issue on BOX or STI regions due to these preclean processes.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated semiconductor device 10 is shown in accordance with the present principles. Device 10 may include a semiconductor-on-insulator (SOI) structure including a base substrate 15, a buried dielectric layer 12 and a semiconductor layer 16. The base substrate 15 may include Si, SiGe, SiGeC, SiC, III-V materials, Ge, etc. Although silicon is the predominantly used semiconductor material in wafer fabrication, alternative semiconductor materials can be employed, such as, but not limited to, germanium, gallium arsenide, gallium nitride, silicon germanium, etc. The buried dielectric layer 12 may include an oxide and, in particular, a silicon oxide, although other materials may be employed. The semiconductor layer 16 may include any suitable semiconductor material, although Si is preferred for the embodiments described.

The semiconductor layer 16 has a mask layer 18 deposited thereon. The mask layer 18 may include a nitride, such as silicon nitride, an oxide or other suitable dielectric materials. The mask layer 18 may be employed as an etch mask, but may also be etched in accordance with an etch mask formed by lithography including a resist. In other embodiments, a spacer image transfer (SIT) process may be employed to form an etch pattern. The semiconductor layer 16 is etched, e.g., by a reactive ion etch (RIE) to form fin structures or templates 14. The RIE may also be employed to etch the mask layer 18 (hardmask).

The etch process selectively removes the semiconductor layer 16 down to the buried dielectric layer 12. It should be noted that the fins 14 may also be formed from a bulk substrate (e.g., instead of a SOI substrate) and a shallow trench isolation (STI) region may be formed about the bases of the fins 14. In this case, the etch process selectively removes the semiconductor layer 16 down to the STI region.

Referring to FIG. 2, a directional deposition process is performed to form a dielectric layer 20 over horizontal surfaces. In one embodiment, the directional deposition deposits silicon nitride. The dielectric layer 20 is formed on and/or into the buried dielectric layer 12 (and/or STI, if present). The dielectric layer 20 may include a thickness of about 3 nm to about 30 nm. The dielectric layer 20 also forms on the mask layer 18.

The directional deposition may include a film-forming gas introduced to a gas cluster ion beam (GCIB) to produce a film-forming GCIB, and a plurality of gas clusters collectively move together as the film-forming GCIB in a direction towards the buried dielectric layer 12. A pressurized gas mixture is expanded into a reduced pressure environment to form gas-clusters, the gas-clusters are ionized, and the ionized gas-clusters are accelerated and optionally filtered. The surfaces for deposition are exposed to the film-forming GCIB and, the direction of incidence of the GCIB is substantially perpendicular to the surface plane where the layer 20 is to be formed. The impact of multiple gas clusters on the one or more horizontal surfaces causes the formation of the deposited layer 20 on the one or more horizontal surfaces (e.g., on the mask layer 18 and the buried dielectric 12), while causing substantially insignificant formation of a deposited film on the one or more vertical surfaces. Directional deposition can occur on any surface oriented to lie in a plane perpendicular to the direction of incidence of the GCIB.

As the gas clusters collide with the one or more horizontal surfaces, material is infused in the surface layer or the underlying layer or is formed on the surface layer. As the GCIB dose is increased, the infusion of material transitions to the deposition of material on the surface. Amorphous films having a variety of material compositions that can be produced, and anisotropic (or directional) deposition can be achieved using the GCIB. Once the amorphous film is formed, it may be subjected to one or more thermal cycles (e.g., elevation of temperature) to crystallize the film.

Layer 20 compositions may include Si; Si and C; Si and O, Si and N; Si, C and N; Si, O and C; Si, C and H; Si, O, C and H; Si, O and N; Si, O, C and N, etc. For example, amorphous silicon, amorphous silicon carbide, amorphous silicon oxide, amorphous silicon nitride, amorphous silicon oxynitride, amorphous silicon carbonitride, amorphous silicon oxycarbonitride, etc. can be formed. Additionally, layer 20 compositions may include germanium-containing films, boron-containing films (e.g., B and N, B and C, Si and B; Si, N and B; Ge and B; and Si, Ge and B). Layer 20 compositions can include sulfur-containing films, phosphorus-containing films, arsine-containing films, tungsten-containing films, and fluorocarbon-containing films (e.g., F and C).

According to one example, layer 20 may include Si and N deposited using the introduction of silane ($SiH_4$), and a nitrogen-containing gas such as $N_2$ or $NH_3$ to a GCIB. According to another example, Si and O may be deposited using the introduction of silicon tetrafluoride ($SiF_4$), and an oxygen-containing gas such as $O_2$ to a GCIB. In yet another example, layer 20 may include Si, O and N deposited using the introduction of silicon tetrafluoride ($SiF_4$), an oxygen-containing gas such as $O_2$, and a nitrogen-containing gas such as $N_2$ or $NH_3$ to a GCIB. Alternatively, the oxygen-containing gas and the nitrogen-containing gas may include NO, $NO_2$, or $N_2O$, or a combination of two or more thereof. According to another example, layer 20 may include Si, O, N and C deposited using the introduction of silicon tetrafluoride ($SiF_4$), an oxygen-containing gas such as $O_2$, a nitrogen-containing gas such as $N_2$ or $NH_3$, and methane ($CH_4$) to a GCIB.

In any one of the examples provided above, additional gases can be provided including an inert gas, such as a noble gas. Gas mixtures may be selected based upon compatibility, stability or other criteria.

Exposed lateral surfaces 21 of the fins 14 are precleaned by one of more preclean processes. The preclean process may include, e.g., piranha etch ($H_2SO_4$ and $H_2O_2$), standard clean 1 (SC-1), standard clean 2 (SC-2), etc. or combinations of preclean processes. The underlying buried dielectric (or STI) 12 is protected from the preclean process by the directionally deposited layer 20. The directionally deposited layer 20 provides protection from gouging of the buried dielectric layer 12 or STI. This maintains the dimensions and the integrity of the buried dielectric layer 12 (or STI) for subsequent processing.

Referring to FIG. 3, epitaxial regions 22 are grown from exposed surfaces of the fins 14. Epitaxial growth and/or deposition of the epitaxial regions 22 includes the growth of a semiconductor material on a deposition surface of a semiconductor material, in which the semiconductor material being grown has the same crystalline characteristics as the semiconductor material of the deposition surface. The epitaxial regions 22 may include SiGe, Ge, III-V materials, etc. In one particularly useful embodiment, the fins 14 include silicon and the epitaxial regions 22 include SiGe. In this embodiment, the epitaxial regions 22 include SiGe and provide a Ge source for doping the fins 14. The fins may be doped using a Ge condensation process. The regions 22 and the fins 14 are subjected to an anneal process of up to 1050 degrees C., which drives Ge into the fins 14 and oxidizes the Si in the epitaxial regions 22.

The fins 14 are converted to SiGe fins 26 (FIG. 4) and the epitaxial regions 22 are converted to dielectric regions 24 (FIG. 4) (e.g., oxide) by the condensation process. The buried dielectric layer 12 (and/or STI), are again protected by the layer 20.

Referring to FIG. 4, processed fins 26 are provided. In one embodiment, the fins 26 include SiGe, which is particularly useful in the formation of p-type field effect transistors (PFETs). SiGe material provides a higher mobility channel material for high mobility PFET channel device fabrication. The epitaxial regions 22 are converted to dielectric regions 24. In one embodiment, the Si remaining in the epitaxial regions 22 is oxidized to form a silicon oxide by the condensation process. The buried dielectric layer 12 (and/or STI) remains protected by the layer 20.

Referring to FIG. 5, an etching process is performed to remove the dielectric regions 24 from the fins 26. Since the layer 20 remains, it continues to protect the buried dielectric layer 20 (and/or STI) during the etch process. The etch process is selective to the fins 26. In one embodiment, the dielectric regions 24 include an oxide, and the etch process may include any oxide removing process that removes oxide without damage or with minimal damage to the fins 26.

Referring to FIG. 6, the layer 20 is then removed selective to the fins 26 and the buried dielectric layer 12. The buried dielectric 12 (and/or STI) are in a protected state, which means that there is minimal damage due to precleaning, etching or other processing. Layer 20 prevents damage to the underlying material. The hardmask 18 is also removed by etching. The removal of the layer 20 leaves a shallow recess 30. The recess 30 includes flat and smooth (ungouged) surfaces 32 that provide a stable and suitable structure for further processing. In one embodiment, a selective RIE may be employed to remove the directionally deposited layer 20. The fins 26 will form the channel regions for fin field effect transistors (finFETs). The fins 26 will have a gate structure formed transversely thereon and patterned. Next, the formation of source and drain regions is performed on opposite sides of the gate structure. Processing continues to complete the device(s).

Referring to FIG. 7, a device structure is shown after the removal of the directionally deposited layer 20 in a structure where a bulk substrate 34 has been employed. Fins 36 formed from the substrate 34 are processed (e.g., Ge condensation) to form SiGe or other material for high mobility operation. In one embodiment, the fins 36 include SiGe formed in a similar manner as fins 26 (FIG. 6) using a condensation process. STI regions 38 were protected by a directionally deposited layer 20 (not shown). The layer 20 was removed selective to the fins 36 and the STI 38 (as well as a hardmask on top of the fins 36 (similar to mask layer 18 in FIG. 5). The removal of the layer 20 leaves a shallow recess 40. The recess 40 includes flat and smooth (ungouged) surfaces 42 that provide a stable and suitable structure for further processing. In one embodiment, a selective RIE may be employed to remove the directionally deposited layer 20. The fins 36 will form the channel regions for fin field effect transistors (finFETs). The fins 36 will have a gate structure formed transversely thereon and patterned. Next, the formation of source and drain regions is performed on opposite sides of the gate structure. Processing continues to complete the device(s).

Referring to FIG. 8, methods for forming a fin device are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, semiconductor fins are formed over a first dielectric layer. The semiconductor fins may be patterned with lithographic processing, SIT patterning processes or other patterning techniques. The fins may be formed in a semiconductor layer of a SOI substrate, or may be formed in a bulk substrate. The first dielectric layer may include a buried dielectric layer for the SOI substrate and/or an STI region (e.g., for the bulk substrate). A hardmask may be formed on the fins as part of the patterning process to protect the fins or the hard mask may be employed as an etch mask for forming the fins. The hard mask is formed/patterned before directionally depositing the second dielectric layer and is removed after the second dielectric layer is removed.

In block 104, a second dielectric layer is directionally deposited into or on the first dielectric layer and on tops of the fins on horizontal surfaces. Horizontal surfaces means parallel with a major surface of the substrate on which the device is formed. The second dielectric layer is configured to protect the first dielectric layer during subsequent processing. Directional deposition may include a film-forming gas introduced to a gas cluster ion beam (GCIB) to produce a film-forming GCIB where a plurality of gas clusters collectively move together as the film-forming GCIB. The first dielectric layer may include an oxide and directionally deposited, second dielectric layer may include silicon nitride.

In block 106, sidewalls of the fins are precleaned while the first dielectric layer is protected by the second dielectric layer. Precleaning may include any suitable cleaning or etching process to remove native oxides or other materials from the sidewall surface of the fins.

In block 108, epitaxial regions are grown on the sidewalls of the fins. The epitaxial regions may include SiGe grown of Si fins, although other materials may be employed. In block 110, material from the epitaxial regions is diffused (e.g., condensed) into the fins to form high mobility fins while altering the epitaxial regions to form dielectric regions. The condensation process employs an anneal or heat treatment (e.g., up to 1050 degrees C.) to diffuse materials into the fins. During the anneal, the epitaxial regions are converted to a dielectric regions. For example, the epitaxial regions are oxidized.

In block 112, the dielectric regions are removed. The dielectric regions may be removed by a selective etch process to remove the dielectric regions from the high mobility fins. In block 114, the second dielectric layer is removed to expose the first dielectric layer in a protected state. The second dielectric layer is removed by a selective etch. The buried dielectric layer and/or STI is/are pristine and undamaged despite the harsh chemistries and processing of the preclean process and other processes.

In block 116, processing continues to form finFET devices. In one example, a gate structure and source/drain regions are formed. The finFETs are preferably high mobility fins (high carrier mobility) to form a channel region for the finFET. This is particularly useful in the formation of PFET devices.

It should be understood that the present principles may be applied to devices structures other than finFETs. The directional deposition processes may be employed to protect surfaces for any device structures or within any processing sequences.

Having described preferred embodiments for directional deposition of a protection layer (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a fin device, comprising:
   forming semiconductor fins over a first dielectric layer;
   anisotropically depositing a second dielectric layer directly into or on the first dielectric layer and on the horizontal top surfaces of the semiconductor fins, wherein the second dielectric layer covers at least a portion of the first dielectric layer between adjacent semiconductor fins, and is configured to protect the first dielectric layer in subsequent processing;
   precleaning sidewalls of the semiconductor fins, while the first dielectric layer is covered by the second dielectric layer; and
   removing the second dielectric layer to expose the first dielectric layer in a protected state.

2. The method as recited in claim 1, wherein the first dielectric layer includes a buried dielectric layer for a semiconductor on insulator substrate.

3. The method as recited in claim 1, wherein the first dielectric layer includes a shallow trench isolation region.

4. The method as recited in claim 1, wherein the semiconductor fins include silicon, the method further comprising:
growing epitaxial semiconductor regions on the sidewalls of the semiconductor fins, the epitaxial grown semiconductor regions including SiGe; and condensing material from the epitaxial grown semiconductor regions into the semiconductor fins by an annealing process to drive Ge into the semiconductor fins and oxidize the epitaxial grown semiconductor regions.

5. The method as recited in claim 4, wherein condensing material from the epitaxial regions into the fins includes forming high mobility fins while oxidizing the epitaxial regions.

6. The method as recited in claim 4, further comprising:
removing the oxidized epitaxial regions to expose sidewalls of the fins.

7. The method as recited in claim 1, further comprising forming a hardmask on the fins before anisotropically depositing the second dielectric layer.

8. The method as recited in claim 1, further comprising forming a gate structure and source/drain regions to form a fin field effect transistor (finFET) where the fin forms a channel region for the finFET.

9. The method as recited in claim 1, wherein anisotropically depositing the second dielectric layer includes anisotropically depositing the second dielectric layer by a gas cluster ion beam (GCIB).

10. A method for forming a fin device, comprising:
forming semiconductor fins over a first dielectric layer;
forming a hardmask on the fins;
anisotropically depositing a second dielectric layer on the first dielectric layer and on the hardmask on tops of the semiconductor fins, the second dielectric layer being configured to protect the first dielectric layer between the semiconductor fins in subsequent processing;
precleaning sidewalls of the semiconductor fins while the first dielectric layer is protected by the second dielectric layer;
epitaxially growing a semiconductor region on each of the precleaned sidewall surfaces, wherein at least a portion of the second dielectric layer is between the epitaxially grown semiconductor region and the first dielectric layer;
converting at least a portion of the epitaxially grown semiconductor regions to dielectric regions using an annealing process;
removing the dielectric regions; and
removing the second dielectric layer to expose the first dielectric layer in a protected state.

11. The method as recited in claim 10, wherein the first dielectric layer includes a buried dielectric layer for a semiconductor on insulator substrate.

12. The method as recited in claim 10, wherein the first dielectric layer includes a shallow trench isolation region.

13. The method as recited in claim 10, wherein the fins include silicon and the epitaxial grown semiconductor regions include SiGe; and the method further comprises condensing material from the epitaxial grown semiconductor regions into the semiconductor fins by an annealing process that drives Ge into the semiconductor fins and oxidizes the epitaxial grown semiconductor regions.

14. The method as recited in claim 13, further comprising:
removing the oxidized epitaxial regions to expose sidewalls of the fins.

15. The method as recited in claim 13, wherein condensing material from the epitaxial regions into the fins includes forming high mobility fins while oxidizing the epitaxial regions.

16. The method as recited in claim 10, further comprising forming a gate structure and source/drain regions to form a fin field effect transistor (finFET) where the fin forms a channel region for the finFET.

17. The method as recited in claim 10, wherein the first dielectric layer includes an oxide and anisotropically depositing the second dielectric layer includes anisotropically depositing silicon nitride.

18. The method as recited in claim 10, wherein anisotropically depositing the second dielectric layer includes anisotropically depositing the second dielectric layer by a gas cluster ion beam (GCIB).

* * * * *